US008604469B2

(12) United States Patent
Lee et al.

(10) Patent No.: US 8,604,469 B2
(45) Date of Patent: Dec. 10, 2013

(54) THIN FILM TRANSISTOR ARRAY PANEL

(75) Inventors: Woo-Geun Lee, Yongin-si (KR); Jae-Hyoung Youn, Seoul (KR); Ki-Won Kim, Suwon-si (KR); Young-Wook Lee, Suwon-si (KR); Jong-In Kim, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 295 days.

(21) Appl. No.: 12/464,920

(22) Filed: May 13, 2009

(65) Prior Publication Data
US 2009/0302316 A1 Dec. 10, 2009

(30) Foreign Application Priority Data
Jun. 5, 2008 (KR) .................. 10-2008-0053050

(51) Int. Cl.
*H01L 29/10* (2006.01)

(52) U.S. Cl.
USPC .......... 257/43; 257/59; 257/72; 257/E29.273; 257/E29.296

(58) Field of Classification Search
USPC ..................... 257/43, 57, 59, 72; 438/759
See application file for complete search history.

(56) References Cited

U.S. PATENT DOCUMENTS

| 4,633,284 A | 12/1986 | Hansell et al. | |
|---|---|---|---|
| 2003/0122986 A1* | 7/2003 | Cho ............................. | 349/43 |
| 2004/0114059 A1* | 6/2004 | Lee et al. ..................... | 349/39 |
| 2006/0023138 A1* | 2/2006 | Choi et al. ................... | 349/46 |
| 2006/0033868 A1* | 2/2006 | Yang et al. ................... | 349/114 |
| 2006/0170835 A1* | 8/2006 | Jun et al. ..................... | 349/38 |
| 2007/0069215 A1* | 3/2007 | Kim ............................. | 257/72 |
| 2007/0072439 A1* | 3/2007 | Akimoto et al. ............. | 438/795 |
| 2007/0108446 A1* | 5/2007 | Akimoto ...................... | 257/61 |
| 2007/0252153 A1* | 11/2007 | Koyama ....................... | 257/72 |
| 2008/0049176 A1* | 2/2008 | Kim et al. .................... | 349/114 |
| 2010/0051947 A1* | 3/2010 | Yabuta et al. ................ | 257/57 |
| 2010/0065818 A1* | 3/2010 | Kim et al. .................... | 257/14 |
| 2010/0134708 A1* | 6/2010 | Kimura et al. ............... | 349/38 |

FOREIGN PATENT DOCUMENTS

| JP | 2001-223364 | | 8/2001 |
|---|---|---|---|
| JP | 2001-326360 | | 11/2001 |
| JP | 2003-273366 | | 9/2003 |
| JP | 2004-022727 | | 1/2004 |
| JP | 2005-033172 | | 2/2005 |
| JP | 2007-123861 | | 5/2007 |
| KR | 102000021376 | | 4/2000 |
| KR | 10-2002-39466 | * | 5/2002 |
| KR | 1020020039466 | | 5/2002 |
| KR | 2002-0078294 | * | 10/2002 |
| KR | 10-2007-57505 | * | 6/2007 |
| KR | 1020070070723 | | 7/2007 |
| WO | WO 2008/102651 | * | 8/2008 |

* cited by examiner

*Primary Examiner* — A. Sefer
(74) *Attorney, Agent, or Firm* — F. Chau & Associates, LLC

(57) ABSTRACT

A thin film transistor array panel includes a substrate, a gate line formed on the substrate and including a gate electrode, a gate insulating layer formed on the gate line, a semiconductor formed on the gate insulating layer and including a channel of a thin film transistor, a data line formed on the semiconductor and including a source electrode and a drain electrode formed on the semiconductor and opposite to the source electrode with respect to the channel of the thin film transistor, wherein the channel of the thin film transistor covers both side surfaces of the gate electrode.

13 Claims, 3 Drawing Sheets

THIN FILM TRANSISTOR ARRAY PANEL

CROSS-REFERENCE TO RELATED APPLICATION

This application claims priority to Korean Patent Application No. 10-2008-0053050 filed on Jun. 5, 2008, the entire contents of which are incorporated herein by reference.

BACKGROUND OF THE INVENTION

1. Technical Field

The present disclosure relates to a thin film transistor array panel, and more particularly to a thin film transistor array panel having an increased channel width.

2. Discussion of the Related Art

In a flat panel display such as a liquid crystal display (LCD) or an organic light emitting diode (OLED) display, a thin film transistor (TFT) is used as a switching element for independently driving each pixel. A thin film transistor array panel includes the thin film transistor. The thin film transistor array panel further includes a scanning signal line (or, a gate line) for transmitting a scanning signal to the thin film transistor, and a data line for transmitting a data signal to the thin film transistor and a pixel electrode connected to the thin film transistor.

The thin film transistor includes a gate electrode connected to the gate line, a source electrode connected to the data line, a drain electrode connected to the pixel electrode, and a semiconductor layer disposed between the drain electrode and source electrode on the gate electrode. A channel of the thin film transistor is formed in the semiconductor layer disposed between the source electrode and the drain electrode.

To increase resolution of the display device, a size of the pixel is decreased. When the size of the pixel is decreased, a width of the thin film transistor needs to be more than a predetermined value to obtain the characteristics of the thin film transistor. However, when the area occupied by the thin film transistor is increased, the aperture ratio is decreased.

SUMMARY OF THE INVENTION

According to exemplary embodiments of the present invention, a width of a TFT channel is increased without increasing the area of the thin film transistor.

According to an exemplary embodiment of the present invention, a thin film transistor array panel includes a substrate, a gate line formed on the substrate and including a gate electrode, a gate insulating layer formed on the gate line, a semiconductor formed on the gate insulating layer and including a channel of a thin film transistor, a data line formed on the semiconductor and including a source electrode, and a drain electrode formed on the semiconductor and opposite to the source electrode with respect to the channel of the thin film transistor, wherein the channel of the thin film transistor covers both side surfaces of the gate electrode.

The semiconductor may be an oxide semiconductor.

The oxide semiconductor may comprise an oxide including zinc (Zn), gallium (Ga), tin (Sn) or indium (In), or a composite oxide thereof including zinc oxide (ZnO), indium-gallium-zinc oxide (InGaZnO4), indium-zinc oxide (In—Zn—O), or zinc-tin oxide (Zn—Sn—O).

The thin film transistor array panel may further include a passivation layer formed on the data line and the drain electrode, and including a contact hole exposing the drain electrode, and a pixel electrode formed on the passivation layer and connected to the drain electrode through the contact hole.

The passivation layer may include a lower inorganic layer and an upper organic layer, and the upper organic layer may have a flat surface.

A passivation layer formed on the data line and the drain electrode and including a contact hole exposing the drain electrode, and a pixel electrode formed on the passivation layer and connected to the drain electrode through the contact hole, may be included.

The passivation layer may include a lower inorganic layer and an upper organic layer, and the upper organic layer may have a flat surface.

According to an exemplary embodiment of the present invention, both side surfaces of the gate electrode may be used as the width of the channel of the thin film transistor such that the width of the channel may be increased without increasing the area of the thin film transistor.

According to an exemplary embodiment of the present invention, a thin film transistor array panel includes a substrate, a gate electrode formed on the substrate, a gate insulating layer formed on the gate electrode, and a semiconductor formed on the gate insulating layer, wherein a channel of a thin film transistor comprises a portion of the semiconductor covering both side surfaces of the gate electrode and the upper surface of the gate electrode.

According to an exemplary embodiment of the present invention, a thin film transistor array panel includes a substrate, a gate line formed on the substrate and including a gate electrode, a gate insulating layer formed on the gate line, a semiconductor formed on the gate insulating layer and including a channel of a thin film transistor, a data line formed on the semiconductor and including a source electrode, and a drain electrode formed on the semiconductor and opposite to the source electrode with respect to the channel of the thin film transistor, wherein a width of the channel of the thin film transistor is increased by the width of both side surfaces of the gate electrode.

BRIEF DESCRIPTION OF THE DRAWINGS

Exemplary embodiments of the present invention can be understood in more detail from the following descriptions taken in conjunction with the accompanying drawings, in which.

DETAILED DESCRIPTION OF EXEMPLARY EMBODIMENTS

The present invention will be described more fully hereinafter with reference to the accompanying drawings, in which exemplary embodiments of the invention are shown. This invention may, however, be embodied in many different forms and should not be construed as limited to the exemplary embodiments set forth herein. It will be understood that when an element such as a layer, film, region, or substrate is referred to as being "on" another element, it can be directly on the other element or intervening elements may also be present.

A thin film transistor array panel according to an exemplary embodiment of the present invention is described with reference to FIG. 1 to FIG. 3.

Figure 1:
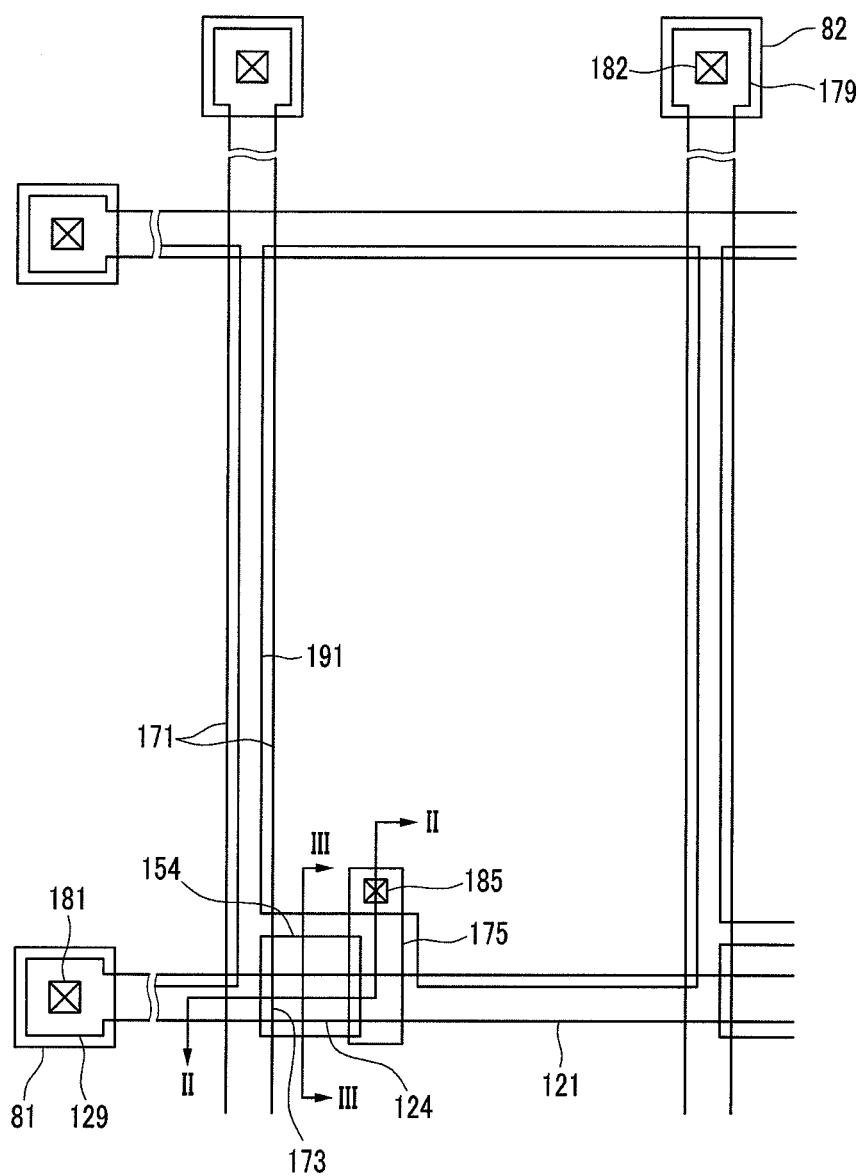
FIG. 1 is a layout view of a thin film transistor array panel according to an exemplary embodiment of the present invention.

FIG. 1 is a layout view of a thin film transistor array panel according to an exemplary embodiment of the present invention. FIG. 2 is a cross-sectional view of the thin film transistor array panel shown in FIG. 1 taken along the line II-II.

Figure 2:
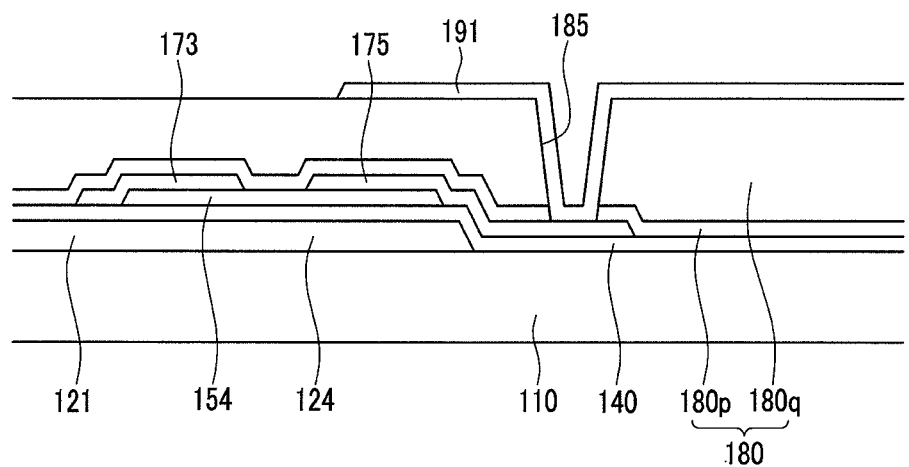
FIG. 2 is a cross-sectional view of the thin film transistor array panel shown in FIG. 1 taken along the line II-II.

Referring to FIG. 1 and FIG. 2, in a thin film transistor array panel, a plurality of gate lines 121 for transmitting gate signals are formed on an insulating substrate 110. Each gate line 121 includes a gate electrode 124 and a wide end portion 129 for connecting the gate line 121 to an external circuit.

The gate lines 121 can have a thickness of about 1 μm to about 2 μm, and sides of the gate lines 121 are inclined with respect to the surface of the substrate 110 at an angle of about 30 degrees to about 80 degrees.

A gate insulating layer 140 is formed on the gate lines 121. Semiconductors 154 comprising an oxide including zinc (Zn), gallium (Ga), tin (Sn) or indium (In), or a composite oxide thereof such as zinc oxide (ZnO), indium-gallium-zinc oxide (InGaZnO$_4$), indium-zinc oxide (In—Zn—O), or zinc-tin oxide (Zn—Sn—O), is formed on the gate insulating layer 140.

A plurality of data lines 171 and a plurality of drain electrodes 175 are formed on the semiconductors 154 and the gate insulating layer 140.

The data lines 171 extending substantially in the longitudinal direction intersect the gate lines 121, and transmit data signals. Each data line 171 includes a source electrode 173. The drain electrode 175 is formed in the longitudinal direction. A portion of the drain electrode 175 overlaps the gate line 121. The source electrode 173 and the drain electrode 175 are opposite to each other with respect to the gate electrode 124.

Like the gate lines 121, the sides of the data lines 171 and the drain electrodes 175 are inclined with the respect to the surface of the substrate 110 at an angle of about 30 degrees to about 80 degrees.

A gate electrode 124, a source electrode 173, and a drain electrode 175 form a thin film transistor along with the semiconductor 154. A channel of the thin film transistor is formed in the semiconductor 154 between the source electrode 173 and the drain electrode 175.

A passivation layer 180 is formed on the gate insulating layer 140, the data line 171, and the drain electrode 175. The passivation layer 180 includes a lower layer 180p comprising an inorganic material and an upper layer 180q comprising an organic material. The upper layer 180q has a flat surface.

The passivation layer 180 has a plurality of contact holes 185 and 181 respectively exposing the drain electrodes 175 and the end portions 179 of the data lines 171. The passivation layer 180 and the gate insulating layer 140 have a plurality of contact holes 181 exposing the end portions 129 of the gate lines 121.

Pixel electrodes 191 and a plurality of contact assistants 81 and 82 are formed on the passivation layer 180.

Each pixel electrode 191 is connected to the drain electrode 175 through the contact hole 185 and receives a data voltage through the drain electrode 175.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and assist the adhesion of the end portions 129 and 179 and external devices such as, for example, driving ICs.

Figure 3:
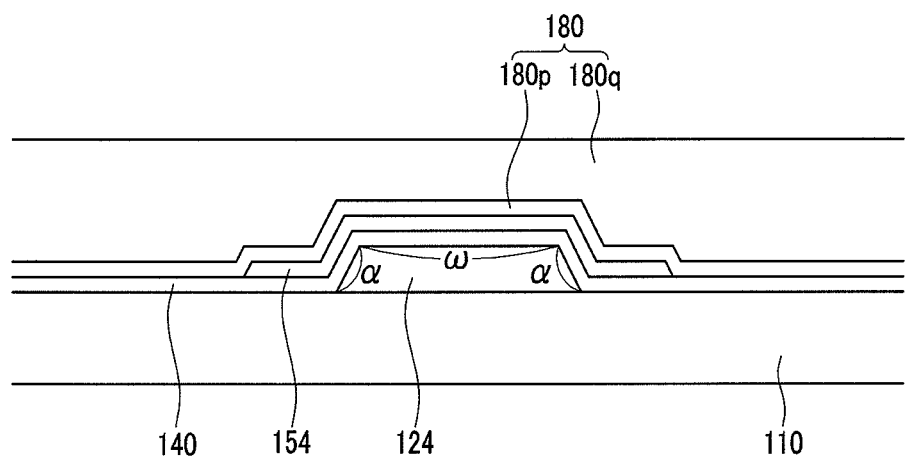
FIG. 3 is a cross-sectional view of the thin film transistor array panel shown in FIG. 1 taken along the line III-III.

FIG. 3 is a cross-sectional view of the thin film transistor array panel shown in FIG. 1 taken along the line III-III.

Referring to FIGS. 1 through 3, each semiconductor 154 covers a gate electrode 124.

The semiconductor 154 comprises an oxide including zinc (Zn), gallium (Ga), tin (Sn), or indium (In), or a composite oxide thereof such as zinc oxide (ZnO), indium-gallium-zinc oxide (InGaZnO$_4$), indium-zinc oxide (In—Zn—O), or zinc-tin oxide (Zn—Sn—O). In an exemplary embodiment, the semiconductor 154 may be formed to completely cover the gate electrode 124.

The channel of the thin film transistor is formed in the semiconductor 154 between the source electrode 173 and the drain electrode 175. In an exemplary embodiment of the present invention, a portion of the semiconductor 154 ascends according to or along the gate electrode 124 of the gate line 121 in the width direction such that the semiconductor 154 includes a portion corresponding to both side surfaces of the gate electrodes 124 and the upper surface of the gate electrode 124. The source electrode 173 and the drain electrode 175 overlap the semiconductor 154 while ascending according to or along the gate electrode 124 in the width direction. Accordingly, a portion corresponding to both side surfaces of the gate electrodes 124 and the upper surface of the gate electrodes 124 among the semiconductors 154 functions as a channel of the thin film transistor. Accordingly, the width of the channel of the thin film transistor is W+2α. Therefore, the width of the channel of the thin film transistor is increased by the width 2α of both side surfaces of the gate electrode 124.

For example, when the thickness of the gate electrode 124 is about 2 μm, the side surface of the gate electrode 124 is inclined by about 45° with respect to the surface of the substrate, and α is about 2.83 μm such that the width of the channel of the thin film transistor is increased by about 5.66 μm.

Accordingly, both side surfaces a of the gate electrode 124 are used as the channel of the thin film transistor such that it is not necessary to increase the area of the thin film transistor to increase the width of the channel of the thin film transistor.

According to exemplary embodiments of the present invention, the thin film transistor including the above structure may be applied to any apparatus or device such as, for example, a thin film transistor array panel for an organic light emitting device and the thin film transistor array panel for the liquid crystal display.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A thin film transistor array panel, comprising:
   a substrate;
   a gate line formed on the substrate and including a gate electrode;
   a gate insulating layer formed on the gate line;
   a semiconductor formed on the gate insulating layer and including a channel of a thin film transistor;
   a data line formed on the semiconductor and including a source electrode, the data line extending substantially in a longitudinal direction in a layout view to intersect the gate line; and
   a drain electrode formed on the semiconductor and opposite to the source electrode with respect to the channel of the thin film transistor, wherein the channel of the thin film transistor covers both side surfaces of the gate electrode in a width direction of the channel of the thin film transistor, the width direction extending along the longitudinal direction of the data line in the layout view, and wherein opposing sides of the gate line across from each other in the longitudinal direction of the data line in the layout view are covered by the channel of the thin film transistor.

2. The thin film transistor array panel of claim 1, wherein the semiconductor is an oxide semiconductor.

3. The thin film transistor array panel of claim 2, wherein the oxide semiconductor comprises an oxide including zinc (Zn), gallium (Ga), tin (Sn) or indium (In), or a composite oxide thereof including zinc oxide (ZnO), indium-gallium-zinc oxide (InGaZnO4), indium-zinc oxide (In—Zn—O), or zinc-tin oxide (Zn—Sn—O).

4. The thin film transistor array panel of claim 3, further comprising:
a passivation layer formed on the data line and the drain electrode, and including a contact hole exposing the drain electrode; and
a pixel electrode formed on the passivation layer, and connected to the drain electrode through the contact hole.

5. The thin film transistor array panel of claim 4, wherein the passivation layer includes a lower inorganic layer and an upper organic layer, and the upper organic layer has a flat surface.

6. The thin film transistor array panel of claim 1, further comprising:
a passivation layer formed on the data line and the drain electrode, and including a contact hole exposing the drain electrode; and
a pixel electrode formed on the passivation layer, and connected to the drain electrode through the contact hole.

7. The thin film transistor array panel of claim 6, wherein the passivation layer includes a lower inorganic layer and an upper organic layer, and the upper organic layer has a flat surface.

8. A thin film transistor array panel, comprising:
a substrate;
a gate line formed on the substrate and including a gate electrode;
a gate insulating layer formed on the gate electrode; and
a semiconductor formed on the gate insulating layer,
wherein a channel of a thin film transistor comprises a portion of the semiconductor covering both side surfaces of the gate electrode in a width direction of the channel of the thin film transistor and the upper surface of the gate electrode, the width direction extending along a longitudinal direction of a data line in a layout view, and
wherein opposing sides of the gate line across from each other in the longitudinal direction of the data line in the layout view are covered by the channel of the thin film transistor.

9. The thin film transistor array panel of claim 8, wherein the semiconductor is an oxide semiconductor.

10. The thin film transistor array panel of claim 9, wherein the oxide semiconductor comprises an oxide including zinc (Zn), gallium (Ga), tin (Sn) or indium (In), or a composite oxide thereof including zinc oxide (ZnO), indium-gallium-zinc oxide (InGaZnO4), indium-zinc oxide (In—Zn—O), or zinc-tin oxide (Zn—Sn—O).

11. A thin film transistor array panel, comprising:
a substrate;
a gate line formed on the substrate and including a gate electrode;
a gate insulating layer formed on the gate line;
a semiconductor formed on the gate insulating layer and including a channel of a thin film transistor;
a data line formed on the semiconductor and including a source electrode, the data line extending substantially in a longitudinal direction in a layout view to intersect the gate line; and
a drain electrode formed on the semiconductor and opposite to the source electrode with respect to the channel of the thin film transistor,
wherein a width of the channel of the thin film transistor is increased by the width of both side surfaces of the gate electrode in a width direction of the channel of the thin film transistor, the width direction extending along the longitudinal direction of the data line in the layout view, and
wherein opposing sides of the gate line across from each other in the longitudinal direction of the data line in the layout view are covered by the channel of the thin film transistor.

12. The thin film transistor array panel of claim 11, wherein the semiconductor is an oxide semiconductor.

13. The thin film transistor array panel of claim 12, wherein the oxide semiconductor comprises an oxide including zinc (Zn), gallium (Ga), tin (Sn) or indium (In), or a composite oxide thereof including zinc oxide (ZnO), indium-gallium-zinc oxide (InGaZnO4), indium-zinc oxide (In—Zn—O), or zinc-tin oxide (Zn—Sn—O).

* * * * *